United States Patent [19]
Mori

[11] Patent Number: 5,214,677
[45] Date of Patent: May 25, 1993

[54] PHASE-LOCKED LOOP WITH SYNC DETECTOR

[75] Inventor: Kunitaka Mori, Tokyo, Japan
[73] Assignee: NEC Corporation, Japan
[21] Appl. No.: 429,409
[22] Filed: Oct. 31, 1989
[30] Foreign Application Priority Data
Nov. 2, 1988 [JP] Japan .................. 63-278884
[51] Int. Cl.$^5$ .............................................. H03D 3/24
[52] U.S. Cl. ................... 375/120; 331/1 R; 455/260
[58] Field of Search ........... 375/118, 119, 120; 328/132, 133, 155; 331/1 A, 4; 370/105.3; 329/307, 346; 455/76, 255, 260

[56] References Cited
U.S. PATENT DOCUMENTS 4,791,488 12/1988 Fukazawa et al. ............. 375/120 X
4,875,108 10/1989 Minuhin et al. .................... 331/1 A
4,933,959 6/1990 Kneahtel .............................. 375/120
4,943,788 7/1990 Laws et al. .......................... 375/120

Primary Examiner—Curtis Kuntz
Assistant Examiner—Tesfaldet Bocure
Attorney, Agent, or Firm—Ostrolenk, Faber, Gerb & Soffen

[57] ABSTRACT

In a sync detection circuit, an input pulse signal at frequency $f_0$ is compared with an output pulse signal from a frequency divider to produce a control signal representative of a difference in frequency or phase between the input and output pulse signals. A voltage-controlled oscillator generates pulses at a frequency $f_0 \times N$ (where $N \geq 2$) when the control signal indicates that the frequency or phase difference is zero or pulses at a variable frequency when the control signal indicates that the frequency or phase difference is non-zero. The frequency divider divides the frequency of the pulses from the oscillator by a factor N to generate the output pulse signal. A decision circuit is provided for detecting when the pulses generated by the oscillator during an interval between pulses of the input pulse signal are equal to at least N to give an indication that a phase alignment is established between the input and output pulse signals. If N is equal to or greater than 4, the decision circuit may comprise a frequency divider for dividing the frequency of the input pulse signal by a factor M (where $M \geq 2$) to define the count interval between successive pulses from the second frequency divider, so that phase alignment occurs when MN pulses of the input pulse signal exist between the counte interval.

4 Claims, 2 Drawing Sheets

PHASE-LOCKED LOOP WITH SYNC DETECTOR

BACKGROUND OF THE INVENTION

The present invention relates generally to phase-locked loops, and more particularly to a phase-locked loop with a sync detection circuit.

A prior art sync detection circuit, as shown and described in U.S. Pat. No. 4,724,402 issued to K. A. Ireland, for a phase-locked loop operates on a one-to-one comparison between the rising or falling edge of the output of a voltage-controlled oscillator and the corresponding edge of an input pulse signal of the phase-locked loop. If two or more edges occur or no edges occur during the period of the input signal, the circuit recognizes that the phase-locked loop has entered an asynchronous condition and determines that it is serious if such condition should continue for several periods of the input signal.

Since it is necessary to monitor the asynchronous condition for several periods of the input signal before making a final decision, a delay is inevitably introduced. Since the degree of precision of a phase-locked loop is proportional to such delay time, a long period of time would be required to monitor the asynchronous condition to implement a high-precision-sync-detection circuit.

SUMMARY OF THE INVENTION

It is therefore an object of the present invention to provide a high-precision-sync-detection circuit without introducing a substantial delay.

According to the present invention, the sync detection circuit comprises a phase detection circuit having a first input terminal to which an input pulse signal at frequency $f_0$ is applied and a second input terminal to which an output pulse signal is applied for producing a frequency control signal representative of a difference in frequency or phase between the input and output pulse signals. A variable frequency oscillator is connected to the phase detection circuit to generate pulses at a fixed frequency $f_0 \times N$ (where N is equal to or greater than 2) when the control signal indicates the absence of frequency or phase difference, or pulses at a variable frequency when the control signal indicates a frequency or phase difference. A frequency divider is provided for dividing the frequency of the pulses generated by the oscillator by a factor N and applying the frequency-divided pulses to the second input terminal as the output pulse signal to form a phase-locked loop. A decision circuit is provided for detecting when the pulses generated by the variable-frequency oscillator during an interval, which is defined between pulses of the input pulse signal, are equal to at least N so as to give an indication that a phase alignment is established between the input and output pulse signals. Therefore, a decision that a phase misalignment has occurred can be quickly made at the instant the number of pulses existing in that interval becomes equal to $N-1$ or $N+1$.

With N being equal to or greater than 4, the decision circuit preferably comprises a second frequency divider for dividing the frequency of the input pulse signal by a factor M to define said interval between successive pulses from the second frequency divider, where M is equal to or greater than 2 and the ratio N/M is equal to or greater than 2.

BRIEF DESCRIPTION OF THE DRAWINGS

The present invention will be described in further detail with reference to the accompanying drawings, in which.

DETAILED DESCRIPTION

Figure 1:
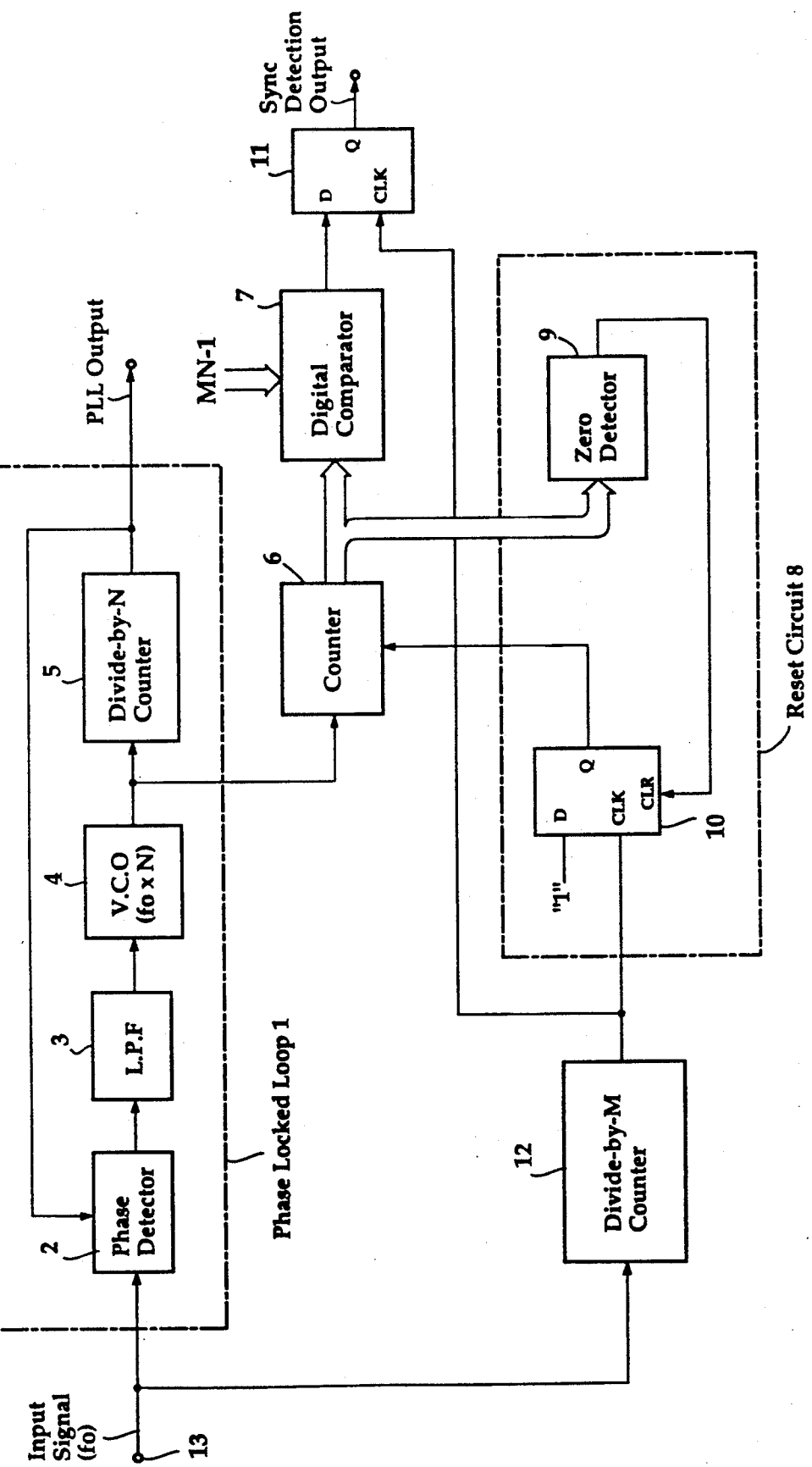
FIG. 1 is a block diagram of a sync detection circuit for a phase-locked loop according to the present invention.

A sync detection circuit of the present invention, as represented in FIG. 1, comprises a binary counter 6 connected to the voltage-controlled oscillator 4 of a phase-locked loop 1, a digital comparator 7, a reset 8 that resets the counter 6 to zero at intervals, a D-type flip-flop 11, and a divide-by-M frequency-dividing counter 12 to which an input signal at a frequency $f_0$ is supplied through a terminal 13. Phase-locked loop 1 includes a phase detector 2 which compares the input signal supplied to terminal 13 with the output of a divide-by-N frequency-dividing counter 5 and supplies a phase difference signal through a low-pass filter 3 to the VCO 4. With a zero-voltage input, the VCO 4 generates a signal at frequency $f_0 \times N$, and varies this frequency as a function of the phase difference signal. The output of VCO 4 is counted down by divide-by-N counter 5 and the output of this counter is supplied to the phase detector 2 as a feedback signal so that the output of phase detector 2 substantially reduces to zero.

The output of VCO 4 is a pulse signal at a frequency which is N times higher than the input frequency of the phase-locked loop 1. Counter 6 is successively incremented in response to pulses from the VCO output and generates a digital signal that represents in binary fashion the count incremented from a count zero that occurs in response to the output of reset circuit 8. The instantaneous value of counter 6 is compared by digital comparator 7 with a binary reference value $(M \times N) - 1$. If coincidence occurs between the two inputs, comparator 7 supplies a coincidence indicating pulse to the D input of flip-flop 11 in order to latch it in response to the output of divide-by-M counter 12.

Reset circuit 8 comprises a zero detector 9 connected to the output of counter 6 and a D-type flip-flop 10 having a clock input coupled to the divide-by-M counter 12, the data input being constantly supplied with a logic 1. The output of flip-flop 10 goes high in response to the leading edge of the output of divide-by-M counter 12 and goes low in response to a pulse supplied to its clear input from zero detector 9 when it detects that the counter 6 is reset to zero. The high-level output of flip-flop 10 is supplied as a reset signal to the counter 6. Counter 6 is of a synchronously-resettable type. With a reset pulse being supplied from flip-flop 10, counter 6 is reset to zero in response to the trailing edge of an output pulse from the VCO 4.

Figure 2:
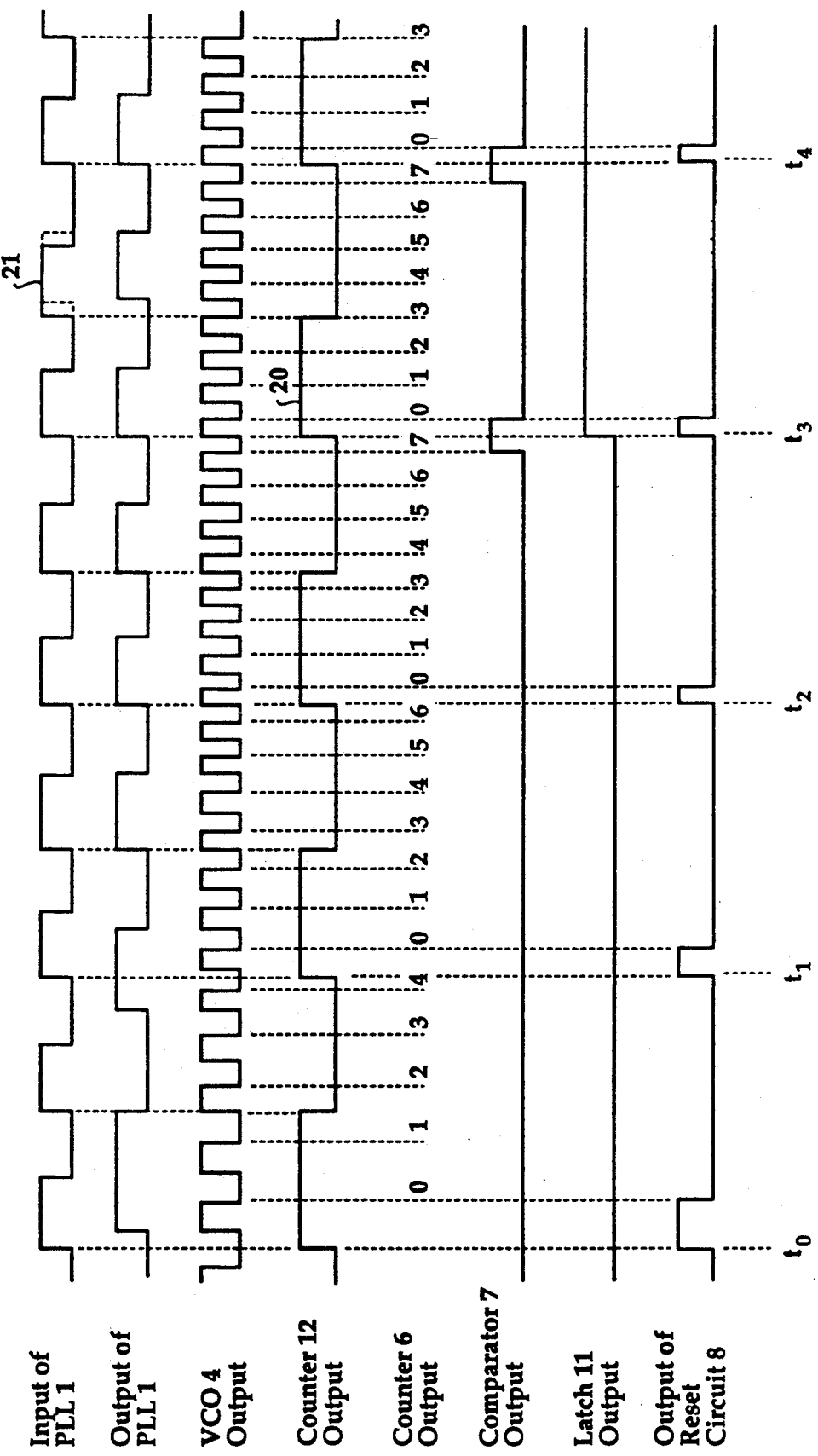
FIG. 2 is a timing diagram associated with the sync detection circuit in which the integers M and N are set equal to 2 and 4, respectively.

The operation of the sync detection circuit will be best understood with reference to a timing diagram shown in FIG. 2. For simplicity of explanation disclosure, the integers M and N are set equal to "2" and "4", respectively. Thus, frequency-dividing counters 12 and 5 operate as divide-by-2 and divide-by-4 counters, respectively. The VCO output frequency is four times higher than the frequency of the input of phase-locked loop 1 and eight times the frequency of the output of divide-by-2 counter 12. Binary counter 6 is, therefore, incremented from zero in response to those pulses from VCO 4 that occur during the interval between successive leading edges of the output of counter 12. The output of digital comparator 7 goes high when binary counter 6 reaches a count value "7" (=2×4−1). In FIG. 2, the output frequency of the phase-locked loop 1 is lower than the input signal and gradually increases, and hence the phase difference between the inputs of phase detector 2 gradually decreases with time. In response to the leading edge of each pulse from the divide-by-2 counter 12, the Q output of flip-flop 10 goes high to generate a reset pulse and counter 6 is reset to zero at the trailing edge of a pulse from VCO 4. This zero count is detected by detector 9 and flip-flop 10 is reset. During the interval between successive leading edges of the output of divide-by-2 counter 12 as indicated by $t_0$ and $t_1$, counter 6 is incremented to a count "4" and during the next interval ($t_1$ and $t_2$), it is shown incremented to a count "6". Since the output of dividing counter 12 appears before counter 6 reaches the reference count "7" during the interval between times $t_0$ and $t_2$, no output is generated from comparator 7. With a further reduction in the phase difference during the interval between times $t_2$ and $t_3$, counter 6 reaches the reference count "7" immediately prior to time $t_3$ and comparator 7 produces an output pulse. If the phase alignment is precise (i.e., if M×N pulses exist during the interval between successive leading edges of output of counter 12), the leading edge transition of the output of counter 12 occurs during the time the output of comparator 7 is high. If this is the case, the high-level output of comparator 7 is latched by flip-flop 11 in response to the leading edge of a pulse 20 from counter 12. Flip-flop 10 responds to this leading edge transition by applying a reset pulse to counter 6 at time $t_3$ and so it is reset to zero, causing the output of comparator 7 to go low. The high level output from flip-flop 11 indicates that a stabilized phase alignment is established between the output of the phase-locked loop and the incoming signal.

If the output frequency of the phase-locked loop becomes higher than the input frequency, the output of comparator 7 goes low prior to the leading edge of the output of counter 12. Because of this misalignment, flip-flop 11 is reset, indicating the occurrence of a phase misalignment.

It is seen that the sync detection circuit of the present invention ensures high precision and a quick search for sync detection. The decision that a phase misalignment has occurrd can be made when the count of VCO pulses existing during the interval between successive pulses of the output of dividing counter 12 becomes equal to or lower than threshold MN-2 or equal to or higher than threshold MN. The time taken to ascertain phase misalignment, or degree of precision, can therefore be represented by values $(MN-1)/MNf_0$ and $(MN+1)/MNf_0$. In the above example, the precision is given by a range of values $7/8f_0$ and $9/8f_0$.

A further advantage of the present invention lies in the fact that if the positon of a pulse in the input of PLL1 is displaced due to jitter as shown at 21 in FIG. 2, divide-by-M counter 12 has the effect of averaging out such displacements so that the interval between successive leading edges of the output of counter 12 is rendered substantially constant and prevents the sync detection circuit from being adversely affected from jitter. However, the frequency-dividing counter 12 could be dispensed with for applications where timing jitter can be tolerated. In such applications, the integer M is set to "1" and N can be set equal to or greater than "2" to give a precision in the range between $1/2f_0$ and $3/2f_0$ for N=2, and $3/4f_0$ and $5/4f_0$ for N=4.

Therefore, according to a broader aspect of the present invention, the integer M is equal to or greater than unity and the ratio N/M is equal to or greater than 2. However, for applications where jitter is not tolerable, it is preferred that the integer M be equal to or greater than 2. For applications where sync detection speed is important and jitter is not tolerable, M is preferably equal to 2.

The foregoing description shows only one preferred embodiment of the present invention. Various modifications will be apparent to those skilled in the art without departing from the scope of the present invention which is limited only by the appended claims. Therefore, the embodiment shown and described is only illustrative, not restrictive.

What is claimed is:

1. A phase-locked loop comprising:

phase detector means for receiving a PLL input pulse signal frequency $f_0$ and for receiving a PLL output pulse signal of said phase-locked loop, said PLL input and output pulse signals being applied to said phase detector means for producing a control signal representative of a difference in frequency or phase between said PLL input and output pulse signals;

a variable-frequency oscillator for generating VFO output pulses having a fixed frequency $N \times f_0$ when said control signal indicates absence of said frequency or phase difference between said PLL input and output pulse signals, first VFO output pulses having a variable frequency when said control signal indicates presence of said frequency or phase difference, where N is equal to or greater than 4;

a first frequency divider for dividing the frequency of said VFO output pulses by N for generating first frequency-divided pulses as said PLL output pulse signal;

a second frequency divider for dividing the frequency of said PLL input pulse signal by an integer M equal to or greater than 2 to produce second frequency-divided pulses at 1/M of the frequency of the PLL input pulse signal; and sync detection means responsive to said VFO output pulses and said second frequency-divided pulses for detecting when the number of said VFO output pulses during an interval between successive pulses generated by the second frequency divider is substantially equal to $M \times N$, and in response thereto, generating a signal indicating that a phase alignment is established between said PLL input and output pulse signals.

2. A phase-locked loop as claimed in claim 1, wherein the sync detection means comprises:

a counter for counting the pulses generated by the variable frequency oscillator and providing a count value representative of the number of counted pulses;

detector means for detecting when said count value is equal to $(M \times N) - 1$ and in response thereto, generating said phase-alignment indicating signal; and means for resetting the counter to zero in response to each of the pulses generated by the second frequency divider.

3. A phase-locked loop with a sync detection circuit as claimed in claim 2, wherein said sync detection means includes a flip-flop for assuming one of the binary states of an output of said detector means in response to each pulse of the frequency-divided input pulse signal supplied from said second frequency divider.

4. A phase-locked loop comprising:

phase detector means for receiving a PLL input pulse signal at frequency $f_0$ and for receiving a PLL output pulse signal of said phase-locked loop, said PLL input and output pulse signals being applied to said phase detector means for producing a control signal representative of a phase difference between said PLL input and output pulse signals;

variable-frequency oscillator means responsive to said control signal for generating VFO output pulses having a frequency which is variable in accordance with said phase difference;

frequency divider means for dividing the frequency of said VFO output pulses by N for generating said PLL output pulse signal, where N is an integer equal to or greater than 2;

sync detection means for receiving said PLL input pulse signal and said VFO output pulses and detecting when M×N pulses are generated by said oscillator means during an interval in which M input pulses are received as said PLL input pulse signal, and in response thereto, generating an output signal indicating that a phase alignment is established between said PLL input and output pulse signals, where M is an integer equal to or greater than 1, wherein said sync detection means comprising:

reset means for generating a reset pulse in response to every M pulses of said PLL input pulse signal;

counter means arranged to be incremented in response to each of said VFO output pulses for producing a count value and resetting the count value to zero in response to said reset pulse; and comparator means for detecting a coincidence between said count value and a reference value, and in response thereto, generating said phase-alignment indicating signal.

* * * * *